United States Patent [19]

Brighton et al.

[11] Patent Number: 5,212,352
[45] Date of Patent: May 18, 1993

[54] SELF-ALIGNED TUNGSTEN-FILLED VIA

[75] Inventors: Jeffrey E. Brighton, Katy; Douglas P. Verret, Sugarland, both of Tex.

[73] Assignee: Texas Instruments Incorporated, Dallas, Tex.

[21] Appl. No.: 633,877

[22] Filed: Dec. 26, 1990

Related U.S. Application Data

[60] Division of Ser. No. 137,389, Dec. 23, 1987, Pat. No. 4,996,133, which is a continuation-in-part of Ser. No. 80,116, Jul. 31, 1987, Pat. No. 4,842,991.

[51] Int. Cl.$^5$ ............................................. H05K 1/00
[52] U.S. Cl. ..................................... 174/264; 174/262
[58] Field of Search ............... 174/250, 256, 258, 264, 174/262, 254, 266; 357/40, 45, 47, 49, 55

[56] References Cited

U.S. PATENT DOCUMENTS

| | | | |
|---|---|---|---|
| 3,652,333 | 3/1972 | Warren | 174/258 X |
| 3,726,002 | 4/1973 | Greenstein | 174/264 X |
| 4,424,251 | 1/1984 | Sugishita | 174/258 X |
| 4,604,496 | 8/1986 | Ishihara | 174/264 |
| 4,927,983 | 5/1990 | Jones et al. | 174/258 |
| 4,977,439 | 12/1990 | Esquivel | 357/55 X |
| 5,006,673 | 4/1991 | Freyman | 174/264 X |
| 5,051,796 | 9/1991 | Gill | 357/45 X |

OTHER PUBLICATIONS

Kolly, J. M., and T. D. Zucconi, "Laminated PC Board System", IBM Technical Disclosure Bulletin, vol. 21, No. 6, Nov. 1978.

Greer, S. E., "Fabrication of Solid Via Structure in Organic Polymers", IBM Technical Disclosure Bulletin, vol. 19, No. 3, Aug. 1976.

IEEE Standard Dictionary of Electrical and Electronics Terms, third edition, The Institute of Electrical and Electronic Engineers, Inc., N.Y., 1984, p. 452.

Primary Examiner—Leo P. Picard
Assistant Examiner—Trinidad Korka
Attorney, Agent, or Firm—W. James Brady, III; B. Peter Barndt; Richard L. Donaldson

[57] ABSTRACT

Via patterns (16, 18) are applied to a first interlevel oxide layer (58) down to a metal layer (52) to define a plurality of orifices. These orifices (61, 63) are filled with tungsten by selective chemical vapor deposition. A first level conductor pattern (10, 12, 14) is then used to etch away the first insulator layer (58) and portions of plugs (62, 64) that are outside the first level conductor pattern. This first level conductor pattern is also used for a subsequent first level metal etch. The entire structure is then covered with a self-planarizing oxide layer (82), which is subsequently etched back to expose the top surfaces (66, 68) of tungsten plugs (62, 64).

7 Claims, 2 Drawing Sheets

SELF-ALIGNED TUNGSTEN-FILLED VIA

RELATED APPLICATION

This is a division of application Ser. No. 07/137,389, filed Dec. 23, 1987, now U.S. Pat. No. 4,996,133, which is a continuation-in-part of application Ser. No. 07/080,116, filed Jul. 31, 1987, now U.S. Pat. No. 4,842,991.

TECHNICAL FIELD OF THE INVENTION

This invention relates in general to semiconductor process technology and more particularly to processes for forming vias between two conductors using selective metal vapor deposition, and vias produced thereby.

BACKGROUND OF THE INVENTION

A number of methods have been investigated for reducing the size of vias between metal layers. Current conventional techniques include the pillar method and the chemical vapor deposition—tungsten via fill method.

The pillar process provides a metal plug connecting two layers of metal, which plug may be self-aligned on the edge of the lower level metal. The pillar is non-nested, i.e., does not require that the patterning be inside the lower level lead lateral boundary. The pillar process includes an oxide planarization which provides a flat surface for the upper level metal. This process has, however, a high process complexity, an additional photomask level when compared to a standard via process, and a very critical planarization process that is susceptible to interlevel shorts.

The conventional via fill process allows vias to be etched with straight walls that greatly improve size control when compared to sloped vias. However, these vias must be aligned to the lower metal layer, and therefore, are required to be nested within the leads. For the conventional via fill process, therefore, it is necessary to either flare the leads or further reduce the via size. The former technique reduces the metal packing density, and the latter technique increases via resistance and current density.

A need has therefore arisen in the industry for a method for building a via which is self-aligned to the edge of the lower metal layer and takes advantage of the CVD-tungsten via fill method. A need has further appeared in the industry for a process that greatly reduces the likelihood of interlevel shorts.

SUMMARY OF THE INVENTION

The present invention comprises an integrated circuit having a via formed to a conductor. An elongate conductor is formed on a support layer such that sides of the conductor extend outwardly (upwardly) from the support layer. An outer surface of the conductor has a lateral boundary defined by the sides. A first insulator layer is formed only on this outer surface, with an area of the outer surface not covered by the first insulator layer. The insulator layer defines first and second edges of the area. Third and fourth edges of the area are defined by the outer conductor surface boundary. A second insulator layer is formed to cover all the sides that adjoin the area. A bottom of the via is formed by the area, with sidewalls of the via formed by the first and second insulator layers. The via is filled with a conductive material such as tungsten selectively deposited therein such that the outer surface of the conductive material is substantially coplanar with an outer surface of the first insulator layer.

Another aspect of the invention comprises a method for fabricating a via between conductors. According to this method, a first insulator layer is formed on the surface of a conductor layer. An orifice through the insulator layer is formed to a first area of the conductor surface. The orifice is then filled with a metal plug selectively deposited by chemical vapor deposition. A conductor geometry border is then masked on the first insulator layer and the metal plug such that the border intersects a border of the orifice at at least two points. The first insulator layer and the metal plug are then removed to the extent that it is outside of the conductor geometry border. The conductor layer is also removed outside of this geometry border. In this manner, a first conductor is defined that adjoins a metal plug top surface above it that is not covered by the first insulator.

A second insulator layer is next formed to cover the first conductor, the first insulator and the metal plug. A predetermined portion or depth of the second insulator layer is removed sufficient to reexpose the top surface of the metal plug and a second conductor is formed to contact the surface. In a preferred embodiment, the method further includes the step of planarizing the second insulator layer prior the step of removing portions of it until the conductor area is reexposed.

The present invention provides a significant technical advantage over prior art vias in that very small filled vias can be obtained that are self-aligned edge-on with the first level conductor. The via fill provides a planar surface (i.e., the tungsten is planar with the first insulator layer surface) allowing the second conductor to be flat. This results in optimum reliability and also allows the same process to be repeated to form a second via between second and third metal directly above the first via. The process of the present invention is able to produce a self-aligned, filled edge-on via that is less than one micron in diameter.

BRIEF DESCRIPTION OF THE DRAWINGS

Further aspects of the invention and their advantages may be discerned from the following Detailed Description in conjunction with the appended Drawings in which.

DETAILED DESCRIPTION

Figure 1:
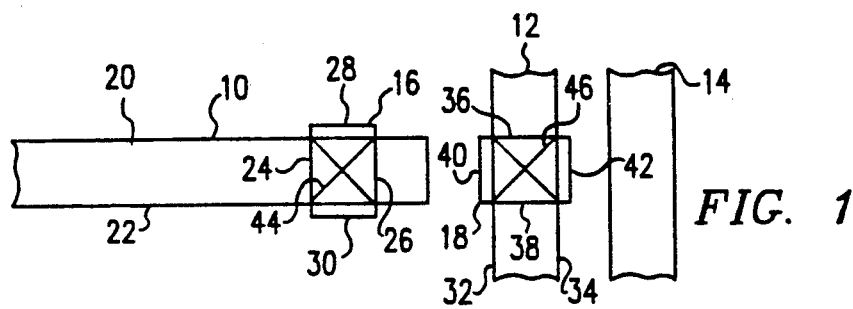
FIG. 1 is a highly magnified schematic plan view showing the juxtaposition of a mask for a plurality of first metal conductors on a support layer, and also showing intersecting via patterns.

FIG. 1 is a plan view of a photomask layout of the invention, showing the placement of three first-level conductors and two vias that are to be opened through an intervening interlevel oxide layer to them. The photomask layout includes a horizontally-disposed elongate conductor lead outline 10 and vertically-disposed, elongate first-level conductor outlines 12 and 14. A via pattern 16 is superimposed over an area of conductor 10, and a via pattern 18 is superimposed over conductor 12. Conductor outlines 10, 12 and 14 comprise a first-level conductor geometry or pattern, and vias 16 and 18 comprise an interlevel insulator layer geometry.

As shown, elongate sidewall boundaries 20 and 22 of first conductor outline or pattern 10 intersect longitudinally-disposed sidewall boundaries 24 and 26 of via pattern 16. Horizontally-disposed boundaries 28 and 30 of via pattern 16 fall outside of elongate boundaries 20 and 22 of conductor pattern 10.

Similarly, elongate sidewall boundaries 32 and 34 of longitudinally disposed conductor pattern 12 intersect horizontally-disposed boundaries 36 and 38 of via pattern 18. The longitudinally disposed boundaries 40 and 42 fall outside of boundaries 32 and 34 of conductor pattern 12. In the illustrated embodiment, conductor pattern 14 does not have a via pattern superimposed thereon, indicating that no via will be formed to this conductor within the illustrated area.

While via patterns 16 and 18 are respectively sited at points between the ends of conductor patterns 10 and 12 such that pattern 16 intersects conductor pattern 10 at four points and such that pattern 18 intersects conductor pattern 12 at four points, patterns 16 and 18 may also be sited exactly on the ends of respective conductor patterns 10 and 12. In this case, boundaries 20 and 22 will intersect via pattern boundary 24 at two points, and would intersect via pattern boundary 26 at an infinite number of points. A similar condition would obtain for the intersection of conductor boundaries 32 and 34 and via pattern boundaries 36 and 38.

While it is preferred that conductor patterns 10 and 12 be rectangularly elongate and that via patterns 16 and 18 be rectangular in shape, patterns 10, 12, 16 and 18 can take any desired shape, as long as the boundaries of via patterns 16 and 18 are farther apart in one dimension than the boundaries of patterns 10 and 12.

As will be described in more detail below, the intersection of conductor pattern 10 with via pattern 16 will define the via to a respective first-level conductor. The via area is shown by an "X" 44. Likewise, "X" 46 will define the area as seen in plan view of a via formed to the conductor corresponding to conductor pattern 12.

Figure 2A:
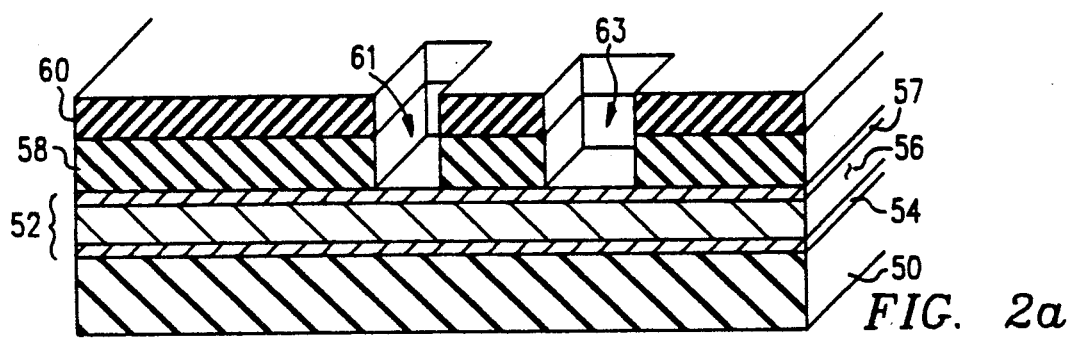
FIGS. 2a-2e are highly magnified schematic isometric views showing successive stages in the fabrication of a plurality of vias according to a preferred embodiment of the invention.

Turning now to FIG. 2a, the first steps in a preferred via fabrication process according to the invention are schematically shown in a magnified sectional and isometric view. A support layer 50 is provided, which for example may be a semiconductor substrate, a dielectric material, or a partially-formed integrated circuit to which connections are desired to be made. A conductor layer 52 is deposited on support layer 50. In the illustrated embodiment, conductor layer 52 comprises a first layer 54 of titanium tungsten alloy (Ti-W), a second layer 56 of aluminum and a third layer 57 of Ti-W. Layers 54, 56 and 57 are illustrated only by way of example; other combinations of metal layers, or a single metal monolayer, or even a nonmetal conductor such as doped polycrystalline silicon may be deposited in their stead.

A first insulator layer 58 is next deposited over metal layer 52. Layer 58 may be deposited by, for example, a low-pressure chemical vapor deposition, and may comprise silicon dioxide. A layer 60 of photoresist is next deposited over first insulator layer 58. Photoresist layer 60 is patterned with via pattern 16 and 18 (see FIG. 1). An etch is performed on the masked first insulator layer 58 down to metal layer 52 to form orifices 61 and 63.

Figure 2B:
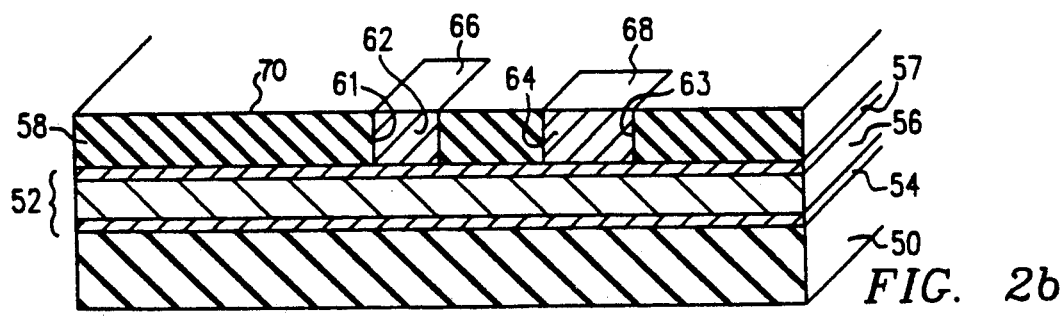

Turning next to FIG. 2b, photoresist layer 60 is removed and a selective chemical vapor deposition (CVD) of a conductive material, such as tungsten or another metal, is performed. The metal is selected such that it will be preferentially nucleate on the surface of metal layer 52 exposed inside orifices 61 and 63, as opposed to dielectric layer 58. Where tungsten is the metal chosen for selective CVD, Ti-W layer 57 is required to prevent the formation of $AlF_3$ on the exposed aluminum. This reaction takes place because $WF_6$ is used as the tungsten-depositing reactant.

This selective CVD step is carried on until the orifices 61 and 63 are filled to create metal plugs 62 and 64. Metal plugs 62 and 64 are accumulated until their respective outer surfaces 66 and 68 are substantially coplanar with the outer surface 70 of first insulator layer 58.

In an alternative embodiment (not shown), the selective CVD step is replaced with a selective metal plating step, either by electroplating or electroless plating, with a metal such as gold or copper. In this instance, refractory metal layer 57 would be replaced with an appropriate seed layer. The copper or gold would be selectively plated on the seed layer until orifices 61 and 63 were filled.

The via fill may also be accomplished by a resist etchback. According to this second alternative embodiment (not shown), the chosen metal is nonselectively deposited over outer surfaces 70 and in vias 61 and 63. The metal surface resulting from this step will have dimples or depressions over the filled vias. A sacrificial organic layer is then next differently deposited so as to be thicker over the depressions and thinner elsewhere, yielding a planar surface. An etchant is then used to simultaneously etch the organic layer and the metal set substantially the same rate back to the surface 70 of first insulator layer 58.

Figure 2C:
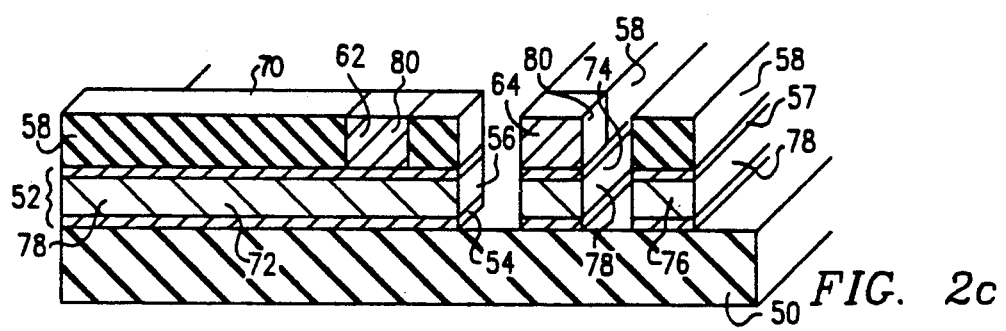

Turning now to FIG. 2c, further stages in the fabrication process according to the invention are shown. A first conductor photoresist layer (not shown) is deposited on first insulator layer 58 and metal plugs 62 and 64. This photoresist layer is patterned with the first-level conductor patterns 10, 12 and 14 (shown in FIG. 1). An etch is then performed to remove those portions of layer 58 and plugs 62 and 64 outside of the first-level pattern boundaries. This etch step may be performed in one step with an etchant such as carbon tetrafluoride, or may be performed by two etch steps sequentially in situ.

After the plug-and first insulator-etch step, metal layers 54, 56 and 57 are etched using the same first-level pattern down to support layer 50. This last etch step will form out of the first metal layer 52 a plurality of first-level conductive leads 72, 74 and 76.

The first insulator layer 58 will exist after this etch step only on top of leads 72, 74 and 76. Sidewalls 78 of leads 72, 74 and 76 are exposed at this stage. Metal plugs 62 and 64 will be reduced in volume, as they will now have sidewalls 80 that are coplanar with respective first conductor sidewalls 78. This etch step will therefore also define the final configuration of metal plugs filled (or vias) 62 and 64.

Figure 2D:
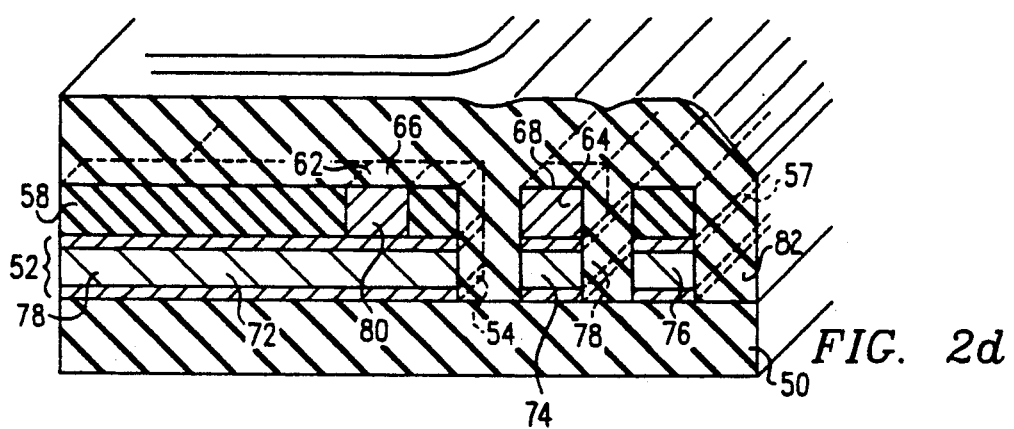

Turning now to FIG. 2d, a second insulator layer 82 such as oxide is deposited over the entire structure. It is preferred that oxide 82 be deposited in a self-planarizing step, such that its depth over leads 72, 74 and 76 will be less than the depth over adjacent regions of support layer 50.

However, an alternative planarization process (not shown) can be used whereby a conformal thick oxide layer is deposited over leads 72, 74 and 76 and support layers 50. This deposition would be followed by the deposition of a sacrificial organic layer on top of the conformal second insulator layer. The sacrificial organic layer may, for example, be applied to the top of the conformal second insulator layer by spinning, such that this organic layer would be thicker in the valleys of the second insulator layer and thinner across the eminences thereof. A planarized surface would then be presented for etching, and an etchant would be selected to etch back the sacrificial layer and the second insulator layer at substantially the same rate. This etchback would continue until top surfaces 66 and 68 of respective plugs 62 and 64 are reexposed.

Layer 82 is deposited to completely cover sidewalls 78 and 80 of the first level leads 72, 74 and 76 and metal plugs 62 and 64.

Figure 2E:
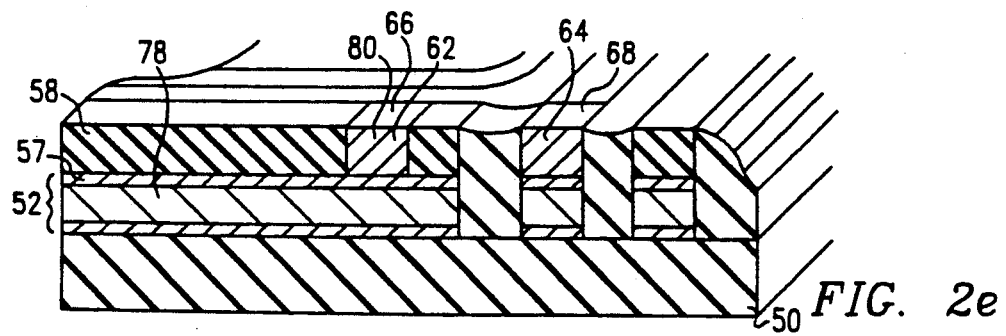

In FIG. 2e, an isometric view of the structure is illustrated subsequent to an etch-back of second insulator layer 82. This etchback will preferably expose only the top surfaces 66 and 68 of metal plugs 62 and 64, leaving metal leads 72, 74 and 76 completely buried by a thick layer of dielectric material. Oxide layer 82 slopes gradually away from the areas where leads 72, 74 and 76 are buried. Subsequently, one or more second level conductors (not shown) are deposited on top of second insulator layer 82 to make contact to selected ones of metal plugs 62 and 64.

The process of the invention provides a significant advantage in that it combines the advantages inherent in a planarized surface provided by a via fill process with the extremely small via size obtained by a self-aligned via. Since the via is self-aligned to at least one edge of the conductor lead, the via can be proportionately larger with respect to the size of the conductor lead.

In summary, a self-aligned selective tungsten-filled via process has been described. A via pattern is first etched into a first interlevel oxide layer to a first level metallic layer, and the orifices thus created are selectively filled with tungsten. Then, a first level metal lead pattern is applied to define a plurality of first level metal leads and a plurality of filled vias on top of them. A second insulator layer is deposited over the entire surface and etched back to expose only the top surfaces of the tungsten plugs.

While illustrated embodiments and their advantages have been described in the above Detailed Description, the invention is not limited thereto, but only by the spirit and scope of the appended claims.

What is claimed is:

1. An apparatus, comprising:
   an elongate conductor formed on a support layer, sides of said conductor extending outwardly from said support layer;
   an outer surface of said conductor having a lateral boundary defined by said sides;
   a first insulator layer formed only on said outer surface, an area of said outer surface not covered by said first insulator layer, said first insulator layer defining first and second edges of said area, third and fourth edges of said area defined by said outer surface lateral boundary;
   a second insulator layer formed to cover all of said sides that adjoin said area;
   a bottom of a via formed by said area, sidewalls of said via formed by said first and second insulator layers; and
   conductive material selectively formed in said via to fill said via, an outer surface of said conductive material substantially coplanar with an outer surface of said first insulator layer.

2. The apparatus of claim 1, wherein said conductive material comprises tungsten.

3. The apparatus of claim 1, wherein said sides are substantially parallel to each other and said outer surface is substantially parallel to said support layer.

4. The apparatus of claim 1, wherein said conductor comprises metal.

5. The apparatus of claim 4, wherein said conductor is formed by a first layer adjacent said support layer, said first layer comprised of titanium-tungsten alloy, a second layer of said conductor formed on said first layer and comprised of aluminum.

6. The apparatus of claim 5, wherein said conductor further comprises a third layer formed on said second layer and comprising titanium-tungsten alloy.

7. The apparatus of claim 1, wherein said first and second insulator layers are comprised of silicon dioxide.

* * * * *